United States Patent
Rivera, Jr. et al.

(10) Patent No.: US 10,386,897 B2
(45) Date of Patent: Aug. 20, 2019

(54) SMART DEVICE COOLING SYSTEM

(71) Applicants: John V. Rivera, Jr., Bethlehem, PA (US); John V. Rivera, Sr., Melbourne, FL (US)

(72) Inventors: John V. Rivera, Jr., Bethlehem, PA (US); John V. Rivera, Sr., Melbourne, FL (US)

( * ) Notice: Subject to any disclaimer, the term of this patent is extended or adjusted under 35 U.S.C. 154(b) by 0 days.

(21) Appl. No.: 15/650,803

(22) Filed: Jul. 14, 2017

(65) Prior Publication Data

US 2018/0143672 A1 May 24, 2018

Related U.S. Application Data

(60) Provisional application No. 62/362,233, filed on Jul. 14, 2016.

(51) Int. Cl.
*H05K 7/20* (2006.01)
*G06F 1/20* (2006.01)

(52) U.S. Cl.
CPC ........... *G06F 1/203* (2013.01); *H05K 7/2039* (2013.01); *H05K 7/20145* (2013.01)

(58) Field of Classification Search
None
See application file for complete search history.

(56) References Cited

U.S. PATENT DOCUMENTS

| | | | | |
|---|---|---|---|---|
| 6,415,612 B1 * | 7/2002 | Pokharna | ................ | F25B 21/02 165/80.2 |
| 9,313,875 B2 * | 4/2016 | Wikander | ............. | G06F 1/1656 |
| 9,615,476 B2 * | 4/2017 | Rayner | ................... | H05K 5/061 |
| 9,698,623 B2 | 7/2017 | Adams et al. | | |
| 2006/0104017 A1 * | 5/2006 | Chang | ................... | G06F 1/1632 361/679.41 |
| 2010/0008036 A1 * | 1/2010 | Risher-Kelly | ........ | G06F 1/1632 361/679.47 |
| 2011/0279968 A1 * | 11/2011 | Lin | ....................... | G06F 1/1632 361/679.47 |
| 2012/0099262 A1 * | 4/2012 | Reber | ................... | G06F 1/1632 361/679.4 |
| 2014/0007594 A1 | 1/2014 | Lofy et al. | | |
| 2014/0185241 A1 * | 7/2014 | MacDonald | ............ | G06F 1/203 361/704 |
| 2014/0233186 A1 * | 8/2014 | Savelli | .................... | H01L 23/34 361/699 |
| 2016/0066477 A1 * | 3/2016 | Liu | .................... | H05K 7/20509 62/3.2 |
| 2017/0149270 A1 | 5/2017 | Adams et al. | | |
| 2017/0164515 A1 | 6/2017 | Lofy et al. | | |

(Continued)

*Primary Examiner* — Courtney L Smith

(74) *Attorney, Agent, or Firm* — Beusse, Wolter, Sanks & Maire PLLC; John L. DeAngelis

(57) ABSTRACT

An enclosure for use with a portable electronic device. The enclosure comprises a plurality of connected walls defining surfaces of the enclosure for receiving the electronic device. Power for the electronics components of the enclosure is supplied from an on-board power source (battery) and from an external power source via a port. A thermoelectric cooler, operating in conjunction with a gel pack, cools the electronic device. A first surface of the gel pack is disposed in contact with or proximate the thermoelectric cooler and a second surface of the gel pack is in contact with or proximate the electronic device.

19 Claims, 6 Drawing Sheets

(56) References Cited

U.S. PATENT DOCUMENTS

2017/0168531 A1* 6/2017 Casparian ............... G06F 1/206
2017/0242463 A1* 8/2017 Matteson ................ G06F 1/206
2017/0315598 A1* 11/2017 Voth ....................... G06F 1/203

* cited by examiner

SMART DEVICE COOLING SYSTEM

CROSS REFERENCE TO RELATED APPLICATIONS

This patent application claims the benefit of U.S. provisional patent application filed on Jul. 14, 2016 and assigned Application No. 62/362,233, which is incorporated herein in its entirety.

FIELD OF THE INVENTION

The present invention relates to a cooling system for a smart device, i.e., an electronics device having processing and/or communications capabilities.

BACKGROUND OF THE INVENTION

A smart device is an electronic device, generally connected to other devices or networks via different wireless protocols, such as Bluetooth, NFC, Wi-Fi, 3G, etc., that can operate to some extent interactively and autonomously. Several notable types of smart devices are smartphones, phablets and tablets, smartwatches, smart bands and smart key chains. The term can also refer to a ubiquitous computing device. A device that exhibits some properties of a ubiquitous computing device, although not necessarily all properties, is a device that provides an artificial intelligence capability.

Smart devices can be designed to support a variety of form factors and a range of properties and capabilities, including any pertaining to ubiquitous computing devices. The smart devices can be used in three main system environments: the physical world, the human-centered environments, and a distributed computing environment. In 1991 three basic forms for ubiquitous system devices: tabs, pads and boards were established.

Tabs devices comprise personal or wearable devices and are generally centimeter-sized devices. Examples include smartphones and smart cards.

Pad devices are generally personal, hand-held decimeter-sized devices, e.g., laptops.

Boards are generally meter-sized devices with an interactive display, e.g., horizontal surface computers and vertical smart boards.

These three device forms are generally characterized as macro-sized, having a planar form and incorporating visual output displays. These were also envisioned more as information appliances. If one relaxes each of these three characteristics, one can expand the range of these devices into a much more diverse and potentially more useful range of ubiquitous computing devices.

Smart devices can be characterized by the following properties.

Hardware & software ICT (information and communication technology) resources. The hardware components are typically static and fixed at the time of design. The software components, while primarily static, can be supplemented as desired by the user.

A dynamic component-oriented resource capable of receiving and operating with extensions and hardware plug-ins, referred to as a plug and play device.

Remote external service access and execution.

Local, internal autonomous service execution.

Access to specific external environments, such as, human interaction, physical world interaction, and distributed virtual computing interaction.

Ubiquitous computing properties.

Multi-purpose devices e.g., personal office, mobile phone, camera, games console, etc. Multi-functional support eases access & interoperability of multi-functions at runtime, but this can lead to a decreased openness of the system to maintain hardware components and to support more dynamic flexible run-time interoperability.

Mobility: devices are either often loosely bound to users, i.e., accompanied or carried, or can be more tightly bound to users, i.e., wearable computing devices.

Personalized and configured to a specific owner. Device access can be limited to only the owner.

Operation as a single portal, e.g., a Web portal.

Combining internal application services and multiple external services.

External services typically accessed via a remote-area or local area wireless network Open service discovery Intermittent resource access.

A locus of control that resides in the smart device.

Ubiquitous computing can be summarized in terms of several core properties:

Devices need to be networked, distributed and transparently accessible.

Human computer interaction with devices is hidden, to a degree, from its users.

Devices exhibit context awareness of the environment to optimize their operation in that environment.

Some devices can operate, at least to some extent, autonomously, i.e., without human intervention, i.e., the device is "self-governed." These devices can support a multiplicity of dynamic actions and interactions, governed by intelligent decision-making and organizational interaction. This may entail some form of artificial intelligence in order to: handle incomplete and non-deterministic interactions; cooperate and compete between members of organizations; and interact through sharing of context, semantics and goals, etc.

As can be appreciated, it is difficult to set forth a closed set of properties that define all ubiquitous computing devices because of the sheer range and variety of such devices and their applications. Rather than to propose a single definition for ubiquitous computing, a taxonomy of properties for ubiquitous computing has been proposed, from which different kinds of ubiquitous systems and applications can be composed and described.

The term smart device environments has two meanings. First, it can refer to a greater variety of device environments. Three different kinds of environments for devices can be differentiated:

Virtual computing environments that enable smart devices to access pertinent services anywhere and anytime.

Physical environments that may be embedded with a variety of smart devices of different types including tags, sensors, and controllers. These can have different form factors ranging from nano to micro to macro sized.

Human's environments: humans, either individually or collectively, inherently form a smart environment for devices. However, humans may themselves be accompanied by smart devices such as mobile phones, use surface-mounted devices (wearable computing devices) and contain embedded devices (e.g., pacemakers).

Second, the term smart device environments can also refer to the concept of a smart environment which focuses more specifically on the physical environment of the device. The physical environment is smart because it is embedded or scattered with smart devices that can sense and control at least a part of it.

Although smart devices partially overlap in definition with specific types of appliances, such as information appliances, smart devices are characterized and differ in several key ways. First, smart devices in general have a much wider range of form-factors than appliances. Second, smart devices support ubiquitous computing properties. Third information appliances focus on remote interaction with computing environments that tend to be personalized whereas smart devices can also focus significantly on impersonal physical world interactions. The term appliance generally implies that devices are task specific and under the control of some embedded system or application specific operating system, whereas smart devices may support multiple tasks, e.g., a mobile phone can act as a phone but also as a games console, music player, camera, etc.

The current invention addresses issues pertaining to heat generated from the operating electrical systems of any mobile device, smart device, or virtually any electronic device. The heat generated from the constant motion of electrons within the device require that the user "rest" the device to allow it to cool down. Literally, the user must turn the device "off."

BRIEF DESCRIPTION OF THE FIGURES

The skilled artisan will understand that the drawings, as described below, are for illustration purposes only. The drawings are not intended to limit the scope of the present invention in any way.

DETAILED DESCRIPTION OF THE INVENTION

Figure 1:
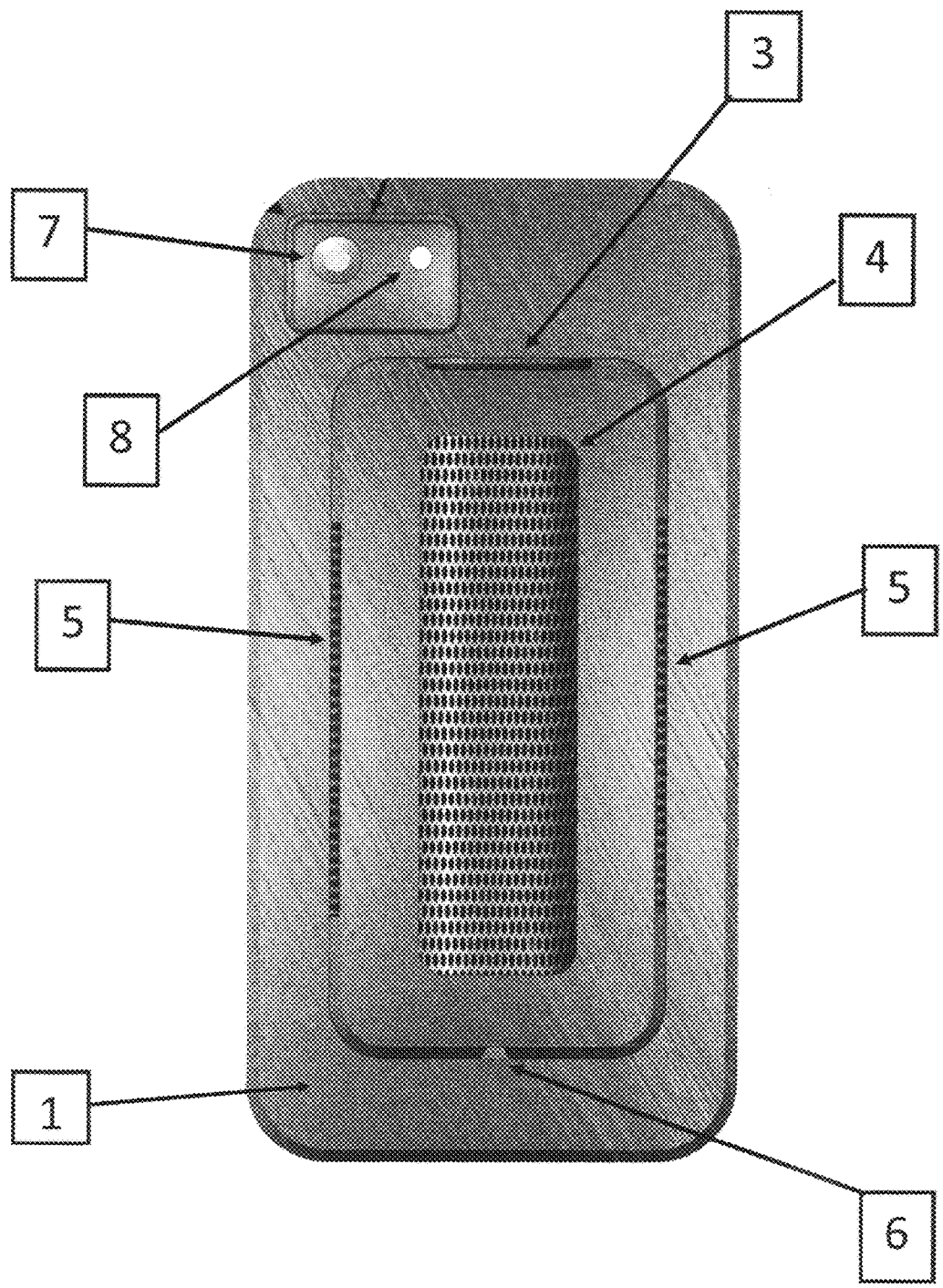
FIG. 1 depicts an external surface of a shell encasement or case comprising a cooling system according to the present invention.

In today's world of high-speed, always-on video gaming and the constant need to be plugged into the internet, there is scant little time to rest the device. People are pushing mobile devices to destruction due to the high heat generated within the device.

Devices are literally catching fire and in some instances exploding. When lithium ion batteries fail, they can do so in spectacular fashion. Lithium ion battery fires not only burn at an extremely hot temperature of up to 1000 degrees Fahrenheit, but can explode, spewing out chunks of burning metal.

There have been numerous complaints of extremely hot portable smart devices. Heat is a major battery killer, either excess of it or lack of it, and Lithium ion cells require careful temperature control for safe operation. Operating at high temperatures can cause destruction of the cell and therefore the device. Although investigation has shown that some lithium battery fires are due to internal short circuits, many, if not most fires are caused by user abuse. This may be deliberate or negligent abuse, such as overcharging or over operating in a high temperature environment or physical damage due to mishandling, but quite often it is unconscious abuse.

In one embodiment, the current invention is a cooling system attachment for an electronic device that can be modified to attach to the back surface of any one of the numerous portable or hand-held devices in use today. The cooling system, comprising, in essence, an active heat sink, can be attached to the portable device while the device is in use. The cooling system dissipates heat generated from electron friction within the electronic device, carrying it away from the device (through one or more thermally conductive paths) thereby maintaining the device's temperature within an optimal range. This temperature control allows the user to extend in-use time and avoid potential destruction of the device from overheating.

This cooling system positively effects overall device use by increasing the ability of the device to operate longer at optimum temperatures. All electronic smart devices will perform better and safer with the cooling system of the invention. This new cooling system will improve smart device performance demonstrably.

One embodiment of the new and dynamic cooling system attaches to the "smart device" as an attachment and or encasement (i.e., a case for the smart device). The smart device will fit into the encasement like a hand into a glove. The cooling system encasement fits around and also protects multiple surfaces of the device.

Once the cooling system is affixed to or encloses the smart device, a user can turn on the cooling system by operation of a switch while the device is operating on battery power or while the device is plugged into a low voltage electrical source. The cooling system derives its required power from a battery or from the low voltage power source, and according to one embodiment derives its power independently from the power delivered to the smart device.

Once the cooling system is operational, it will immediately begin to remove heat from the smart device. The cooling system will remain operational for as long as the user desires, while powered by an electrical source or until recharging is necessary when operating under battery power. In one embodiment the user can manually switch the cooling system "off" and/or the cooling system automatically switches "off" when a thermal sensor indicates that the temperature of the smart device is again within a safe range.

Elements of the cooling system may comprise a simple coolant duct carrying coolant to lower the operating temperature of the smart device and thereby extend its operating life. Alternatively, elements of the cooling system may comprise a thermoelectric cooler and gel pack as described further herein.

The case or encasement is available in various sizes, configurations, and shapes to accept any number of different Android devices, iPhone devices, pads, kindles, larger laptop devices and virtually any electronic device.

As a commercial product, the cooling system has a stealth and clean finished outer appearance and is available in a variety of colors, textures and materials.

According to another embodiment, the cooling device (sometimes referred to as an enclosure, a case, or a shell encasement, since cooling components are embedded therein or attached thereto) attaches to the electronic device in the same manner as described above, however the cooling system incorporates thermoelectric cooling and cooling liquid pathways. This liquid can comprise mineral oil, water, anti-freeze, or a refrigerant gel. In one embodiment, a liquid pack or a liquid circulating system is integrated into one surface of the enclosure as an element of the overall cooling system.

According to one embodiment, the thermoelectric cooler cools a liquid that flows through coolant ducts or pathways in and around and proximate to and in contact with the electronics components of the smart device. Fans blow cooling air across the coolant ducts and across the smart device remove heat from these elements.

In another embodiment, the thermoelectric cooler cools a refrigerant gel disposed within a liquid pack, also referred to as an ice pack or gel pack. Such a pack is typically a portable plastic sac filled with water, refrigerant gel, or liquid. In this application, the contents of the sac are cooled (even to a freezing temperature) by the thermoelectric cooler. Both ice and other non-toxic refrigerants (mostly water) can absorb a considerable amount of heat before they warm above their freezing temperature, due to the high latent heat of fusion of water. Thus, these packs can be used to keep the electronics components of the smart device within a desired operating temperature range.

Water has a much higher latent heat of fusion than most substances, and a melting temperature that is convenient and easily attained by a thermoelectric cooler. Additives to improve the properties of water can be used in the refrigerant gel of the present invention. For example, substances can be added to prevent bacterial growth in the pack, or to prevent the water from solidifying so it remains a thick gel throughout use.

Certain gel packs comprise non-toxic materials that will remain a slow-flowing gel, and therefore will not spill easily or cause contamination if the container breaks. Gel packs may be made by adding hydroxyethyl cellulose, sodium polyacrylate, or vinyl-coated silica gel.

The thermoelectric cooler, when activated by a switch or thermal controller/sensor, operates based on the Peltier effect to create a heat flux between a junction of two different types of materials. A Peltier device is a solid-state active heat pump that transfers heat from one side of the device to the other, as it consumes electrical energy, depending on the direction of current flow. Such an instrument is also called a Peltier heat pump, solid state refrigerator, or thermoelectric cooler. Peltier devices are typically used in cooling applications.

When operated as a cooler, a voltage is applied across the device, and as a result, a difference in temperature will build up between the two sides The liquid pack or gel pack is situated around, near and against the smart device electronics components. The liquid pack maintains a cool temperature from the effects of the thermoelectric cooler and dissipates heat away from the smart device. The thermal control sensor can detect a high temperature and responsive thereto automatically activates the cooling system and in particular the thermoelectric cooler. Once activated it begins to cool the smart device.

A heat sink may also be attached to one or more surfaces of the thermoelectric cooler or the device case to absorb any heat generated by the thermoelectric cooler and the device components. A layer of insulation is disposed between the heat sink and the liquid pack to maintain a distinct barrier between the cool areas of the cooling system and the warmers areas of the cooling system.

Low voltage micro fans may be attached to the top of the heat sink to assist in dissipating heat and lower the temperature of heat sink. In certain embodiments the heat sink is attached to the case at other strategic locations.

FIG. 1 depicts an external surface of a shell encasement or case 1, defining a camera lens port 7 and a flash light (LED) port 8. These openings are aligned with respective lens and LED of the smart device to allow proper functioning of these elements. Also shown are an upper air vent 3, a center air vent 4, and side air vents 5. An electrical plug port 6 (for a USB plug, for example) is also depicted.

Figure 2:
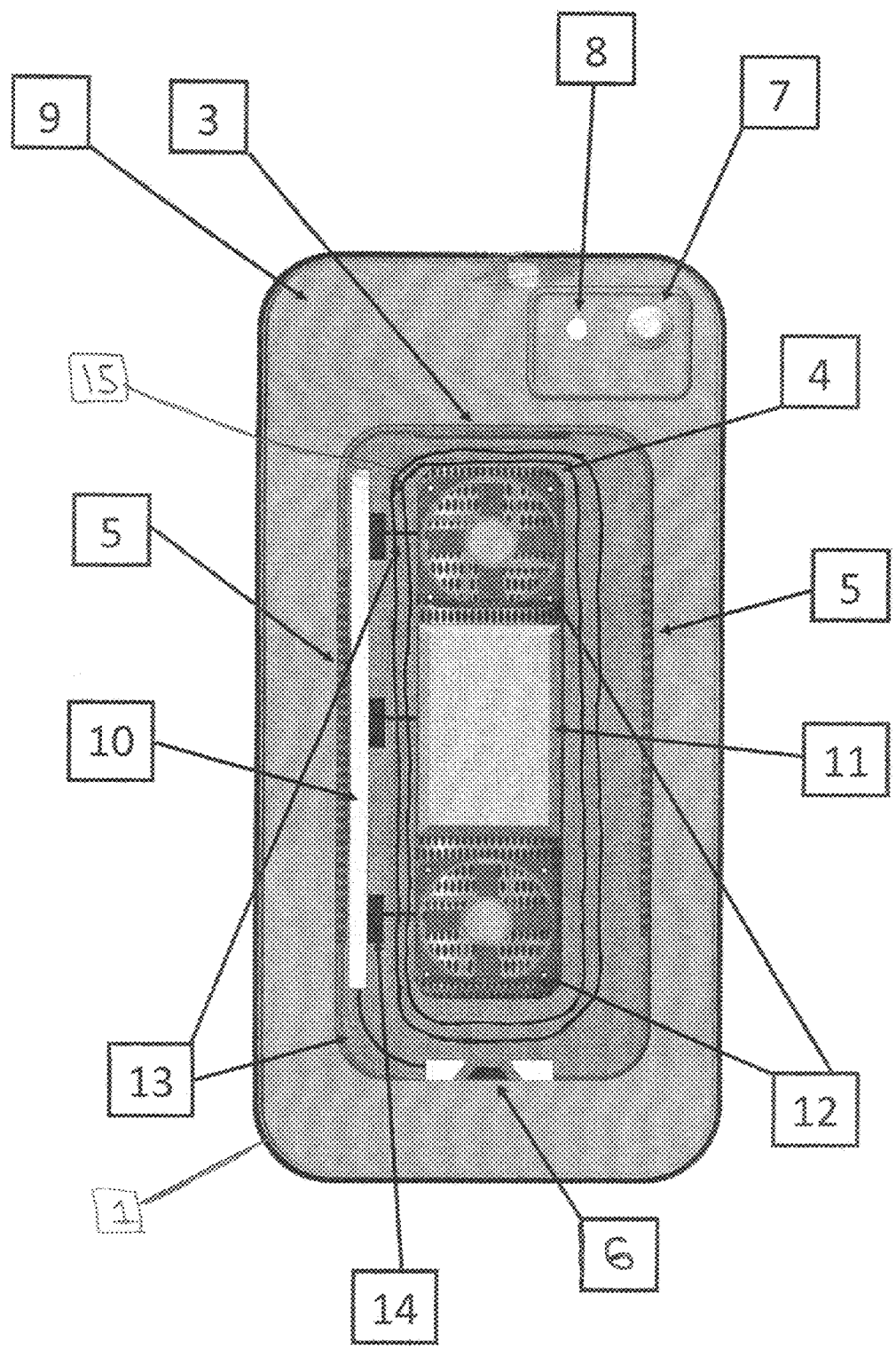
FIG. 2 depicts interior components of the shell encasement or case of FIG. 1.

FIG. 2 depicts an interior region of the shell encasement or case 1. Shown in FIG. 2 are: an electrical wiring connecting bar 10, a battery 11, cooling fans 12, and wires 13 connected between the fans 12 and the electrical port plug 6 for supplying current to the fans. Connectors 14 are connected to conductors for carrying current to/from the battery 11, the port 6, the fans 12 and the thermoelectric cooler 31 (not visible in FIG. 2). FIG. 2 further illustrates a coolant duct 15 through which a coolant is made to flow. A pump (not shown) can be used in conjunction with the coolant duct 15 to force coolant flow through the duct.

Figure 3:
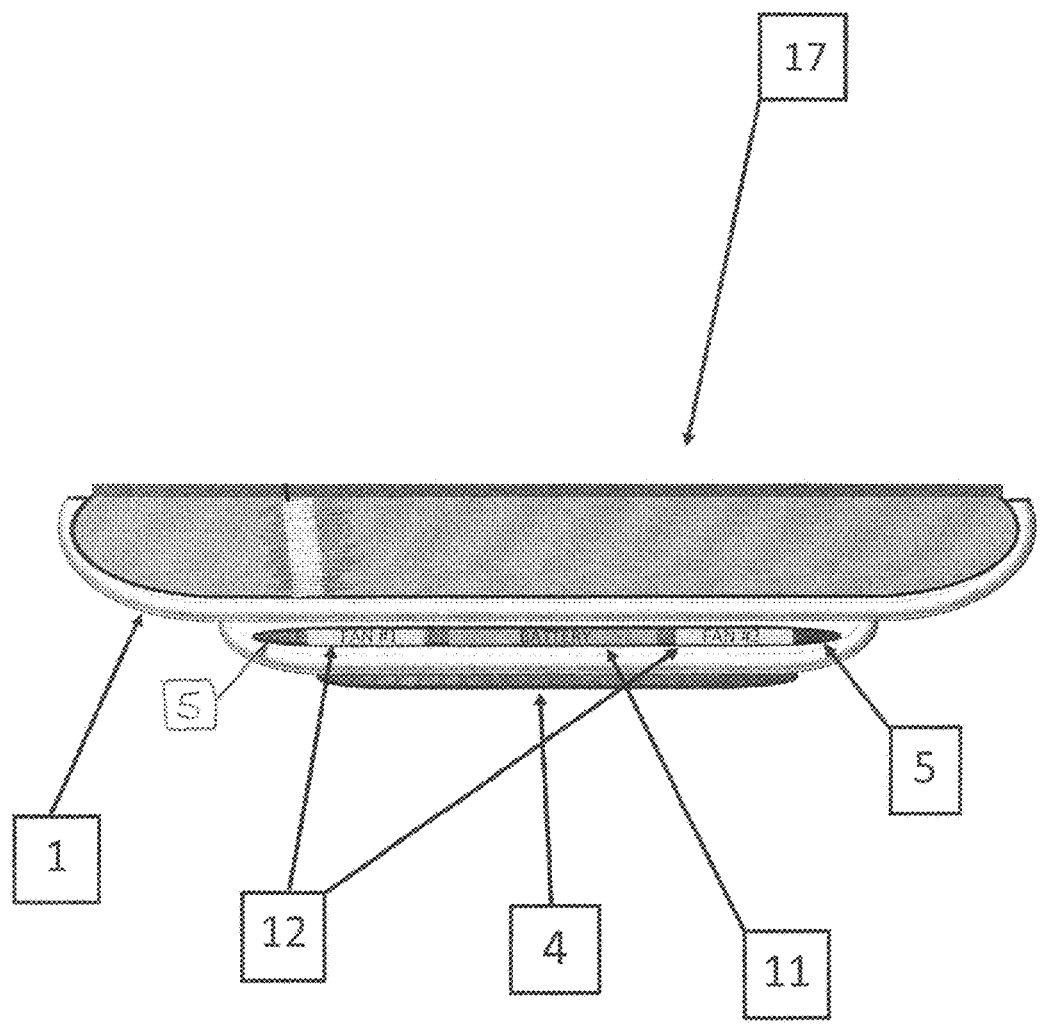
FIG. 3 depicts a side view of the shell encasement or case of FIG. 1.

FIG. 3 depicts a side view of a smart device 17 in contact with the shell encasement or case 1. The side air vents 5, the center air vent 4, the battery 11, and the cooling fans 12 are also shown.

Figure 4:
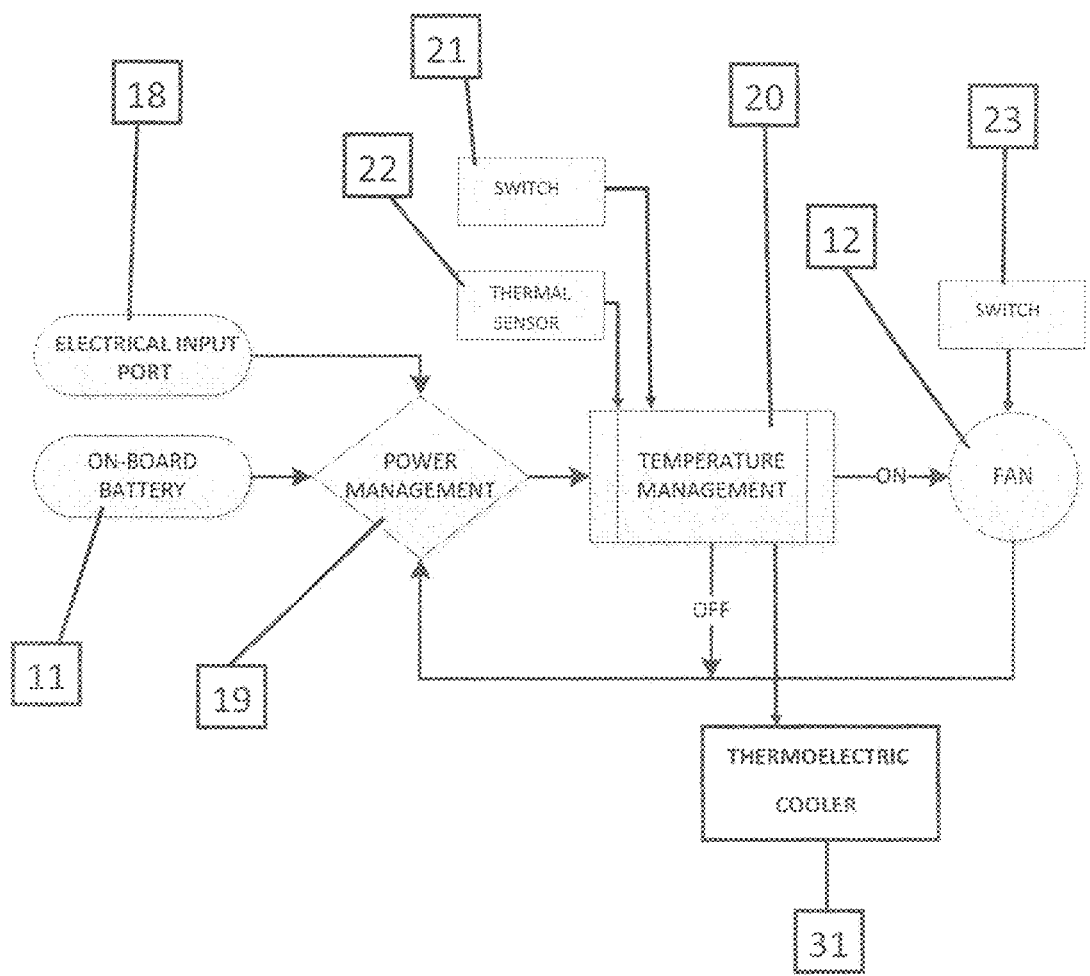
FIG. 4 depicts an electronic schematic of the electrical system of the present invention.

FIG. 4 depicts a block diagram of the operating electrical component of the cooling system. An electrical input port 18 feeds electrical power to a power management module 19 that can switch the source of operating power between the electrical input port 18 and the on-board battery 11. The power management module 19 supplies power to a temperature management module 20 that is activated by a manually operated switch 21 or a thermal sensor 22, which can detect a temperature above a preset threshold. In either case the temperature management module supplies power to the fans 12 when activated. The fans 12 can be turned off automatically once the power management module 20 detects a safe operating temperature or the fans can be switched off manually by way of a switch 23. In one embodiment, the temperature management module 20 is disposed on top of a liquid pack or gel pack 24 (see FIG. 5). The temperature management module 20 also activates and deactivates a thermoelectric cooler 31, which operates as described above.

Figure 5:
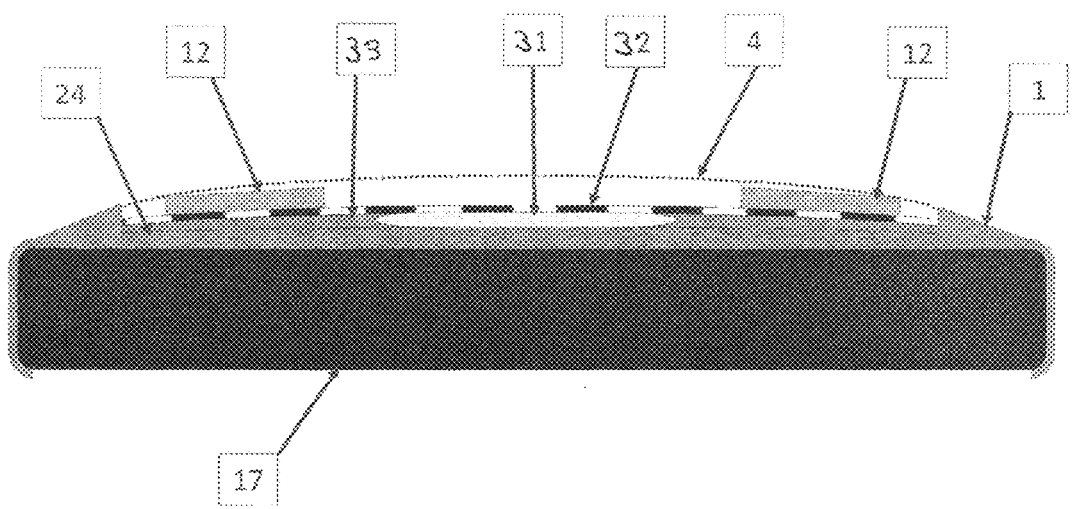
FIG. 5 depicts a side view schematic of shell encasement or case of FIG. 1.

FIG. 5 depicts a side view illustrating various elements of the smart device cooling system of the present invention. The smart device 17 is encased in or attached to the case or encasement 1 that includes the cooling system. The gel pack 24 is in contact with or proximate to the smart device 17. The thermoelectric cooler 31 is in contact with or proximate the gel pack 24. A heat sink 32 is attached to the top of the thermoelectric cooler 31. Insulation 33 is disposed between the heat sink 32 and the gel pack 24. Two micro fans 12 are attached to or proximate a top surface of the heat sink 22. The main vent 4 (see also FIG. 1) is above the fans 12.

Figure 6:
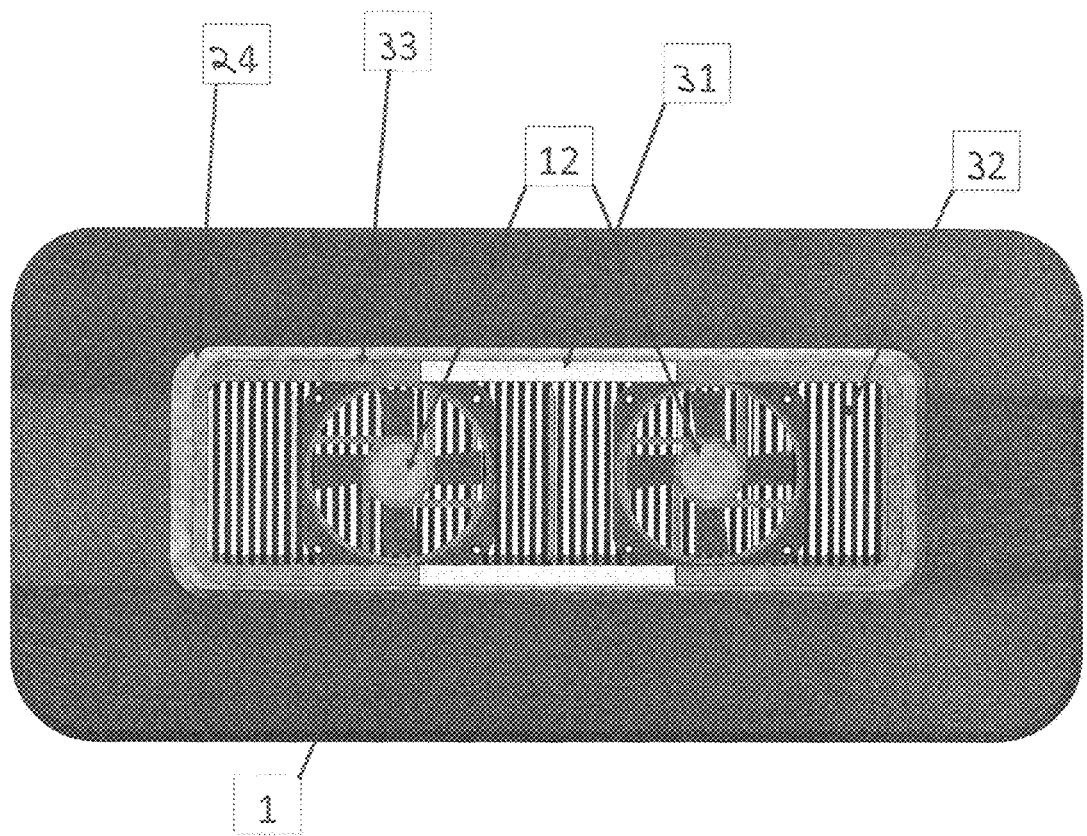
FIG. 6 is a top view of the shell encasement or case of FIG. 1.

FIG. 6 is a top view of the liquid cooled smart device cooling system. This view shows relative placement of the fans 12, the heat sink 32, the thermoelectric cooler 31, the liquid pack 34, and the insulation 33.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. An enclosure for use with a portable electronic device, comprising:
   a plurality of connected walls defining surfaces of the enclosure for receiving the electronic device;
   a power supplying component further comprising at least one of an on-board power source and a port for connecting to an external power source;
   a thermoelectric cooler powered by the power supplying component; and
   a gel pack having a first surface in contact with or proximate the thermoelectric cooler and a second surface in contact with or proximate the electronic device, wherein the gel pack extends over substantially all of an area of a proximate surface of the electronic device.

2. The enclosure of claim 1 wherein the on-board power source comprises a battery.

3. The enclosure of claim 1 wherein the power supplying component supplies power to the enclosure and to the electronic device.

4. The enclosure of claim 1 further defining a plurality of air vents.

5. The enclosure of claim 1 further comprising one or more fans receiving power from the power supplying component and forcing air through one or more of the plurality of air vents.

6. The enclosure of claim 1 further comprising a fan disposed between the gel pack and a region outside of the enclosure and outside of the electronic device.

7. The enclosure of claim 1 the plurality of connected walls further comprising a base surface and four upstanding wall surfaces extending from the base surface, the base surface and the four wall surfaces for enclosing the electronic device such that a display on one surface of the electronic device is visible when the electronic device is captured in the enclosure.

8. The enclosure of claim 1 further comprising a temperature management module powered by the power supplying component for controlling at least one of the thermoelectric cooler and a fan disposed within the enclosure.

9. The enclosure of claim 8 wherein the temperature management module is responsive to a thermal sensor for causing the temperature management module to activate one or both of the thermoelectric cooler and the fan.

10. The enclosure of claim 8 wherein the temperature management module is responsive to a manual switch for causing the temperature management module to activate one or both of the thermoelectric cooler and the fan.

11. The enclosure of claim 1 further comprising a heat sink in contact with one or both of the gel pack and the thermoelectric cooler.

12. The enclosure of claim 11 the heat sink comprising a plurality of upstanding fins extending in a direction away from the electronic device.

13. The enclosure of claim 1 further comprising a coolant duct for receiving a coolant fluid, the coolant duct disposed proximate the electronic device for removing heat therefrom.

14. An enclosure for use with a portable electronic device, comprising:
   a base surface and at least two wall surfaces extending from the base surface, for capturing the electronic device such that a display on one surface of the electronic device is visible when the electronic device is captured in the enclosure;
   an on-board battery;
   a port for connecting to an external power source;
   a plurality of air vents;
   one or more fans when operative for forcing air through one or more of the plurality of air vents;
   a thermoelectric cooler;
   a thermal sensor;
   a temperature management module responsive to the thermal sensor for controlling at least one of the thermoelectric cooler and the one or more fans;
   a gel pack having a first surface in contact with or proximate the thermoelectric cooler and a second surface in contact with or proximate the electronic device;
   a heat sink in contact with one or both of the gel pack and the thermoelectric cooler; and
   a coolant duct for receiving a coolant fluid, the coolant duct disposed proximate the electronic device for removing heat therefrom.

15. The enclosure of claim 14 wherein the battery supplies power to the enclosure and to the electronic device.

16. The enclosure of claim 14 wherein the external power source supplies power to the enclosure and to the electronic device.

17. The enclosure of claim 14 wherein the gel pack extends over substantially all of an area of a proximate surface of the electronic device.

18. The enclosure of claim 14 the heat sink comprising a plurality of upstanding fins extending in a direction away from the electronic device.

19. The enclosure of claim 14 further comprising a power management module for controlling power flow from the on-board battery and from the port.

* * * * *